United States Patent
Cheng et al.

(10) Patent No.: US 9,612,495 B2
(45) Date of Patent: Apr. 4, 2017

(54) ARRAY SUBSTRATE AND DISPLAY DEVICE

(71) Applicant: BOE TECHNOLOGY GROUP CO., LTD., Beijing (CN)

(72) Inventors: Hongfei Cheng, Beijing (CN); Yong Qiao, Beijing (CN); Jianbo Xian, Beijing (CN); Wenbo Li, Beijing (CN); Pan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1 day.

(21) Appl. No.: 14/435,923

(22) PCT Filed: Sep. 18, 2014

(86) PCT No.: PCT/CN2014/086814
§ 371 (c)(1),
(2) Date: Apr. 15, 2015

(87) PCT Pub. No.: WO2015/188492
PCT Pub. Date: Dec. 17, 2015

(65) Prior Publication Data
US 2016/0147123 A1 May 26, 2016

(30) Foreign Application Priority Data

Jun. 13, 2014 (CN) ...................... 2014 2 0317656 U

(51) Int. Cl.
*G09G 3/36* (2006.01)
*G02F 1/1362* (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

2007/0296901 A1* 12/2007 Seo .................. G02F 1/134363
349/141

FOREIGN PATENT DOCUMENTS

| CN | 1716067 A | 1/2006 |
|---|---|---|
| CN | 101093329 A | 12/2007 |

OTHER PUBLICATIONS

Jan. 26, 2015—International Search Report and Written Opinion with Eng Tran.

* cited by examiner

*Primary Examiner* — Ali Naraghi
(74) *Attorney, Agent, or Firm* — Banner & Witcoff, Ltd.

(57) ABSTRACT

An array substrate and a display device are provided. A common electrode line with the same extending direction as a gate line is disposed at one end near a thin film transistor, and forms a storage capacitor with a drain electrode of the thin film transistor. As compared with the case in the prior art that a common electrode line and a thin film transistor in an array substrate are disposed at both ends of a pixel, respectively, and it is necessary to separately provide a storage capacitance electrode useful for forming a storage capacitor with the common electrode line, the pixel region occupied by the thin film transistor and the common electrode line can be effectively decreased. Thus, the aperture ratio is increased, and the display brightness of an IPS liquid crystal display device is enhanced.

18 Claims, 4 Drawing Sheets

(51) Int. Cl.
*G02F 1/1343* (2006.01)
*G02F 1/1368* (2006.01)
*H01L 27/12* (2006.01)

(52) U.S. Cl.
CPC .. *G02F 1/134363* (2013.01); *G02F 1/136213* (2013.01); *H01L 27/124* (2013.01); *G02F 2001/136218* (2013.01)

ARRAY SUBSTRATE AND DISPLAY DEVICE

The application is a U.S. National Phase Entry of International Application No. PCT/CN2014/086814 filed on Sep. 18, 2014, designating the United States of America and claiming priority to Chinese Patent Application No. 201420317656.1 filed on Jun. 13, 2014. The present application claims priority to and the benefit of the above-identified applications and the above-identified applications are incorporated by reference herein in their entirety.

TECHNICAL FIELD

Embodiments of the present invention relate to an array substrate and a display device.

BACKGROUND

Currently, the liquid crystal display technology has been widely used in display of televisions, cell phones and public information, and its picture quality is an important condition for the success of these products. And among a large number of parameters for deciding the picture quality, the brightness of liquid crystal display is an important parameter standard.

In the prior art, the biggest feature of an array substrate of a display device of a liquid crystal display mode of IPS (In Plane Switching) is that, a pixel electrode and a common electrode of it are on the same plane, that is, the common electrode and the pixel electrode are disposed in the same layer. The structure of an array substrate of an existing IPS mode liquid crystal display device, as illustrated in FIG. 1, mainly includes a gate line 1, a data line 2, a thin film transistor 3, a pixel-electrode connecting section 4, a pixel electrode 5, a common electrode 6, a common-electrode connecting section 7 and a common electrode line 8. The region defined by adjacent gate lines and adjacent data lines is a pixel region; a pixel electrode and a common electrode are disposed within a pixel region in a manner of lying in the same layer and being alternate; for the thin film transistor 3, its gate electrode of is connected to the gate line 1, its source electrode is connected to the data line 2, and its drain electrode 9 is connected to the pixel-electrode connecting section 4; and the common electrode line 8 is connected to the common-electrode connecting section 7 through via holes. For the sake of ensuring that the voltage on a pixel electrode within the time of one frame picture is relatively constant, and because the pixel electrode 5 and the common-electrode connecting section 7 are disposed in the same layer, a storage capacitor cannot be arranged between them, and a separate zone is required for arrangement of the storage capacitor. For example, a storage capacitance electrode 91 is disposed at one end near the thin film transistor 3, and one branch 81 of the common electrode line 8 is introduced to the vicinity of the thin film transistor 3, so that a storage capacitor is formed by the common electrode line 8 and the storage capacitance electrode 91. Such a structure brings about the fact that a pixel region is occupied too much by areas occupied by the common electrode line 8 and the thin film transistor 3, and thus, the aperture ratio is decreased, and the light transmittance is reduced. Consequently, the display brightness of the liquid crystal display device is affected.

Therefore, how to raise the aperture ratio of an IPS mode liquid crystal display device is an urgent problem to be solved by those skilled in the art.

SUMMARY

According to embodiments of the present invention, there are provided an array substrate and a display device, for solve such an issue existing in the prior art that the aperture ratio of an IPS liquid crystal display device is small.

According to an embodiment of the invention, there is provided an array substrate, including a gate line, a data line and a common electrode line, a region defined by adjacent gate lines and adjacent data lines is a pixel, which includes a thin film transistor lying in the vicinity of an intersection of the gate line and the data line and electrically connected to the gate line and the data line, respectively, a plurality of pixel electrodes, a pixel electrode connecting section connected to the plurality of the pixel electrodes, a plurality of common electrodes disposed in a same layer as and arranged intervally with the pixel electrodes, and a common electrode connecting section connected to the plurality of the common electrodes, wherein, the common electrode line has a same extending direction as the gate line, and is located at one end of the pixel near the thin film transistor, and forms a storage capacitor with a drain electrode of the thin film transistor;

the pixel further includes a wire for electrically connecting the common electrode line and each of the common electrodes.

In an example, the wire is electrically connected to the common electrodes through the common electrode connecting section.

In an example, an orthographic projection of the wire on the array substrate lies within a region where the data line is located.

In an example, the wire has a same extending direction as the data line, and an orthographic projection of the wire on the array substrate lies between the data line and the pixel electrode adjacent to it.

In an example, an orthographic projection of the wire on the array substrate partially lies within a region where the data line is located.

In an example, the wire is provided in single, and is located at one end of the pixel near the thin film transistor.

In an example, the pixel further includes a shielding electrode line located at one end far away from the thin film transistor;

the shielding electrode line has a same extending direction as the data line;

an orthographic projection of the shielding electrode line on the array substrate lies between a data line and the pixel electrode adjacent to it, or the orthographic projection of the shielding electrode line on the array substrate lies within the region where the data line is located, or the orthographic projection of the shielding electrode line on the array substrate partially lies within the region where the data line is located.

In an example, one end of the shielding electrode line is electrically connected to the common electrode line; or, the other end of the shielding electrode line is electrically connected to the common electrode connecting section; or, both ends of the shielding electrode line is arranged to be floated.

In an example, the shielding electrode line is disposed in a same layer as the wire and the common electrode line.

In an example, the pixel electrodes and the common electrodes are strip-like electrodes extending in a direction parallel to the data line, and the plurality of pixel electrodes and the plurality of common electrodes are distributed alternately.

In an example, the pixel electrode connecting section extends along a direction parallel to the gate line, and ends of the plurality of pixel electrodes near the thin film transistor are connected together; the common electrode connecting section extends along a direction parallel to the gate line, and ends of the plurality of common electrodes far away from the thin film transistor are connected together.

According to an embodiment of the invention, there is provided a display device, including the array substrate provided by embodiments of the invention.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

The thickness of film layers and the size and shape of zones in the attached drawings do not reflect the true scale of components in an array substrate, merely aiming for exemplarily describing contents of the present invention.

Figure 1:
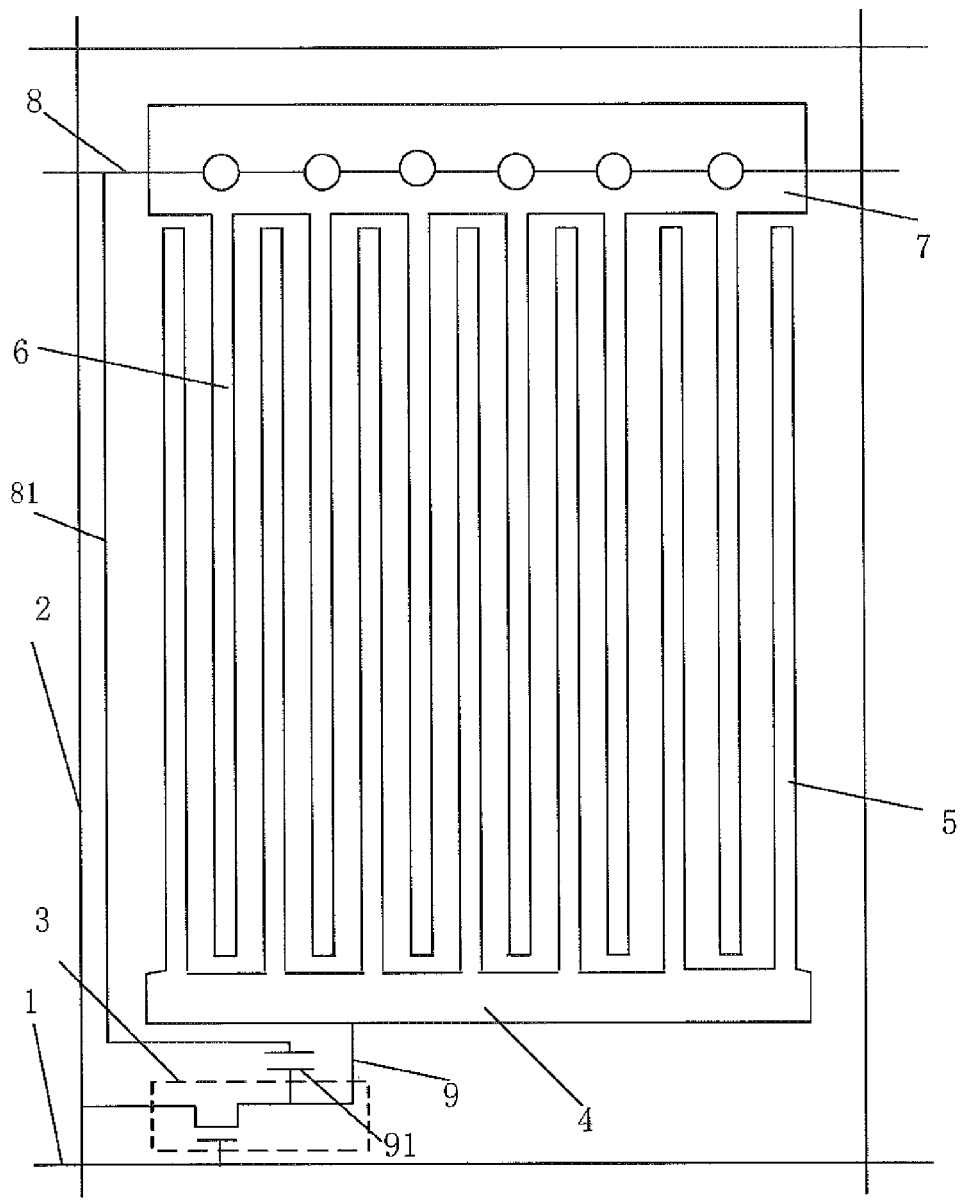
FIG. 1 is a structurally schematic view illustrating an array substrate of an IPS liquid crystal display device in prior art.
Figure 2:
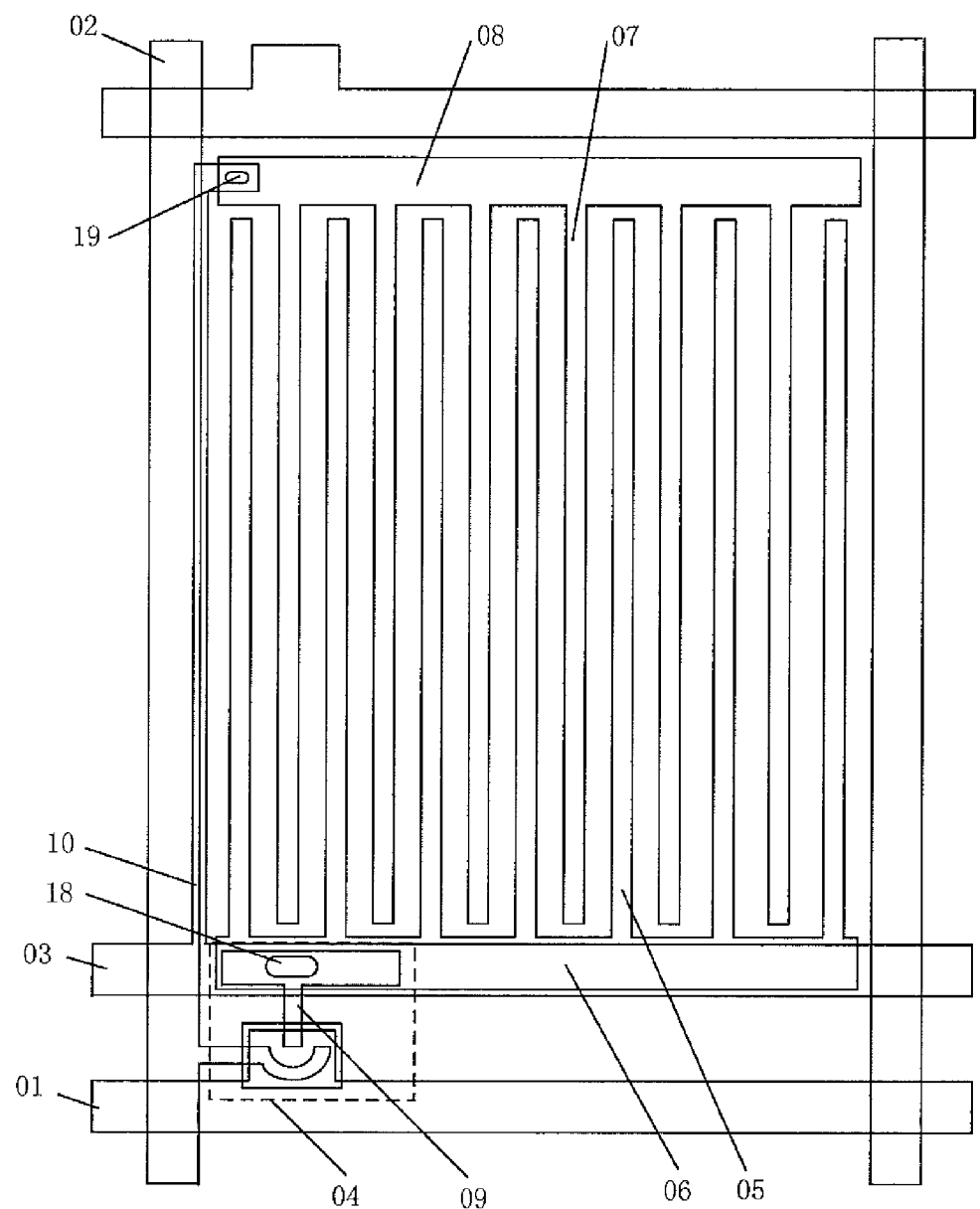
FIG. 2 is a structurally schematic view illustrating an array substrate provided by the invention.

According to the invention, there is provided an array substrate, as illustrated in FIG. 2, which includes gate lines 01, data lines 02 and common electrode lines 03. The region defined by adjacent gate lines 01 and adjacent data lines 02 is a pixel.

The pixel includes a thin film transistor 04 that is situated in the crossing region (intersection) of a gate line 01 and a data line 02 and is electrically connected to the gate line 01 and the data line 02, respectively. For example, a gate electrode of the thin film transistor 04 is connected to the gate line 01, and a source electrode of the thin film transistor 04 is connected to the data line 02. It further includes a plurality of pixel electrodes 05, a pixel-electrode connecting section 06 connected to the plurality of pixel electrodes, a plurality of common electrodes 07 that are disposed in the same layer as and arranged intervally with the pixel electrodes 05, and a common-electrode connecting section 08 connected to the plurality of common electrodes 07.

A common electrode line 03 has the same extending direction as the gate line 01, and it is located at one end near the thin film transistor, and forms a storage capacitor together with a drain electrode 09 of the thin film transistor 04. Generally, the drain electrode 09 of the thin film transistor 04 is connected to the pixel-electrode connecting section 06 through a via hole 18.

The pixel further includes a wire 10 for electrically connecting the common electrode line 03 to each common electrode 07. Generally, the wire 10 is connected to the common-electrode connecting section 08 through a via hole 19.

For example, in the array substrate, the pixel electrodes 05 and the common electrodes 07 are each strip-like electrodes that extend along a direction parallel to the data line 02, and a plurality of pixel electrodes 05 and a plurality of common electrodes 07 are distributed alternately.

For example, the pixel-electrode connecting section 06 extends along a direction parallel to the gate line 01, and serves to connect ends of the plurality of pixel electrodes 05 near the thin film transistor 04 together; the common-electrode connecting section 08 extends along a direction parallel to the gate line 01, and serves to connect ends of the plurality of common electrodes 07 far away from the thin film transistor 04 together.

In the prior art, a common electrode line 03 and a thin film transistor 04 in an array substrate are arranged at both ends of a pixel, respectively, and this requires separate arrangement of a storage capacitance electrode, acting for forming a storage capacitor with a common electrode line 03. In the above array substrate provided by embodiments of the invention, a common electrode line 03 with the same extending direction as a gate line 01 is disposed at one end near a thin film transistor, and forms a storage capacitor together with a drain electrode 09 of the thin film transistor 04, and as compared with the prior art, the pixel region occupied by the thin film transistor 04 and the common electrode line 03 can be effectively decreased, thereby increasing the aperture ratio, and enhancing the display brightness of an IPS liquid crystal display device. Furthermore, in the event that a storage capacitor is formed by the common electrode line 03 and the drain electrode 09 of the thin film transistor 04, the voltage on a pixel electrode 05 in the period of one frame picture can be assured of being relatively constant, thereby guaranteeing the picture quality of display of the IPS liquid crystal display device.

Upon concrete implementation, in the above array substrate provided by embodiments of the invention, the common electrode line 03 may be electrically connected to the common-electrode connecting section 08 through the wire 10, as illustrated in FIG. 2. The common electrode line 03 may also be connected to common electrodes 07 directly through wires 10, that is, without the aid of a common-electrode connecting section 08, the common electrode line 03 is directly connected to each common electrode 07 by way of drawing forth a wire 10 from the place corresponding to each common electrode 07. When the common electrode line 03 is connected to the common-electrode connecting section 08 through a wire 10, it is possible that a signal is directly transmitted to the common-electrode connecting section 08 upon signal transmission, and then transmitted to each common electrode 07; if the common electrode line 03 is directly connected to each common electrode 07, then a signal can be directly transmitted to common electrodes 07 upon signal transmission, and regarding this manner, the signal transmission line is shorter, and the signal is transmitted relatively fast. In practical applications, the connecting relationship of wires can be set according to requirements, and no limit will be set here.

Descriptions will be made below with reference to an example in which a wire 10 is electrically connected to a common-electrode connecting section 08. In general, the wire 10 is arranged to have the same extending direction as a data line 02.

Figure 3:
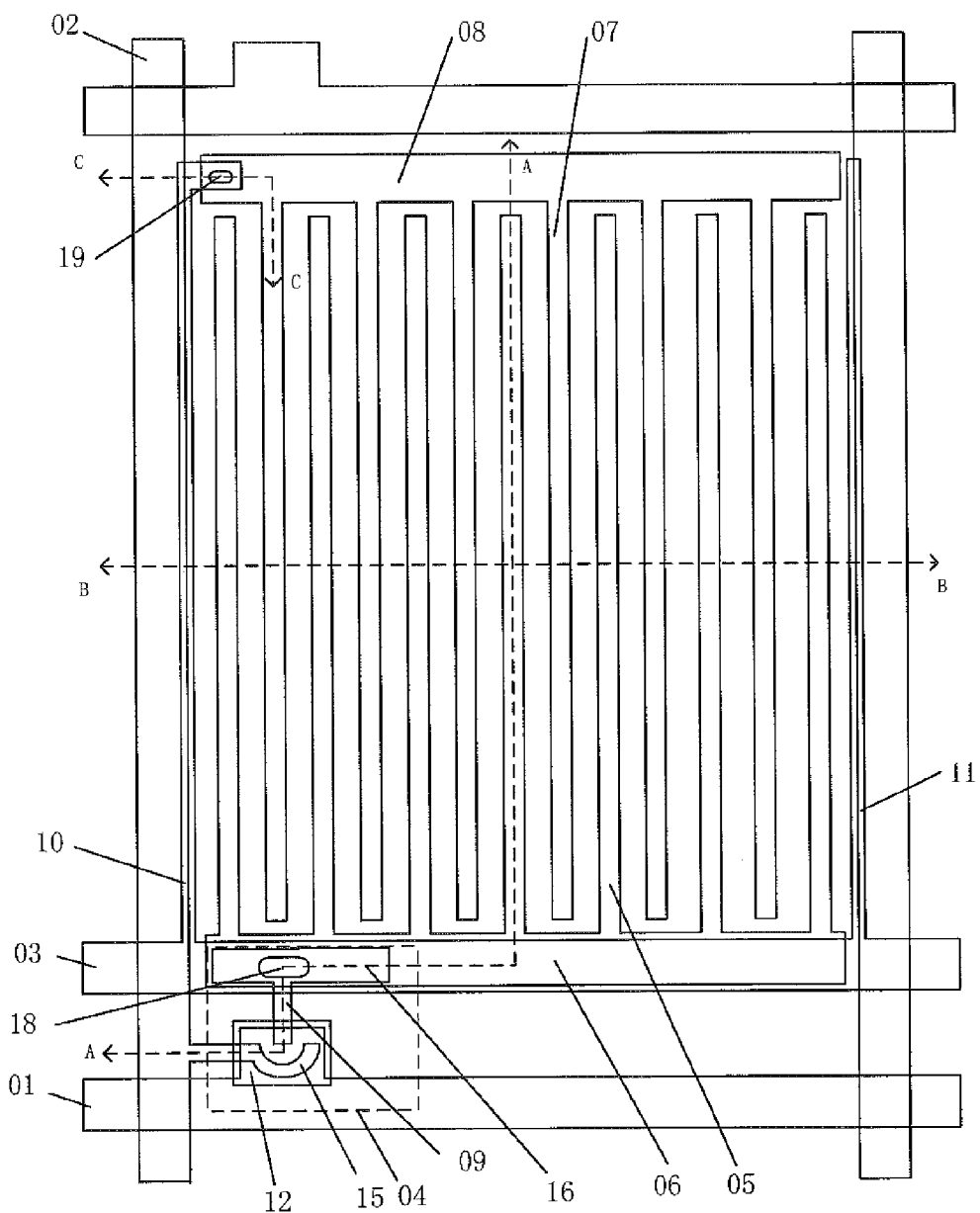
FIG. 3 is a schematic view illustrating the detailed structure of an array substrate provided by the invention.
Figure 4:
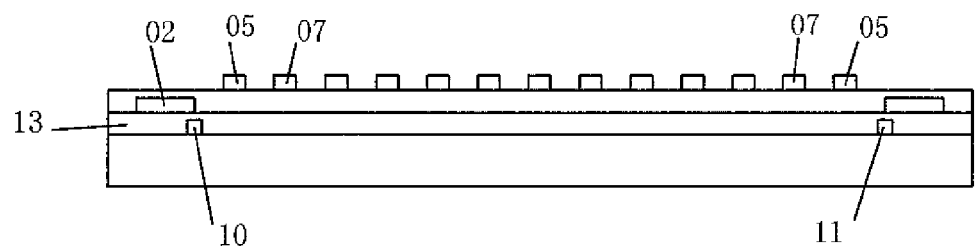
FIG. 4 is a structural schematic sectional view taken along B-B of a schematic view illustrating the detailed structure of an array substrate provided by the invention.

For example, in the above array substrate provided by embodiments of the invention, the data line 02 may be in a contiguous relationship to the pixel electrode 05, as illustrated in FIG. 3 and FIG. 4, and so, the voltage change of the data line 02 will cause interference to voltage on an adjacent pixel electrode 05. Therefore, for the sake of solving this problem, upon concrete implementation, a wire 10 may be used to shield the interference with the adjacent pixel electrode 05 from the voltage change of the data line 02.

For example, the wire 10 may be arranged in such a manner that its orthographic projection on the array substrate lies within the region where a data line 02 is located, that is, the orthographic projection of the wire 10 on the array substrate completely falls within an orthographically projective region of the data line 02 on the array substrate; or, the wire 10 is arranged in such a manner that its orthographic projection on the array substrate lies between a data line 02 and an adjacent pixel electrode 05; or, the wire 10 is arranged in such a manner that its orthographic projection on the array substrate partially lies within the region where a data line 02 is located. No limit will be set here. Upon concrete implementation, when the mode of arranging a wire 10 on an array substrate is any of the above modes, the wire 10 not only can serve a wire for connecting a common electrode line 03 and a common electrode, thereby conducting the transmission of a common electrode signal; but also can serve a shielding electrode for shielding the interference with the voltage on a pixel electrode 05 from the voltage change of a data line 02, thereby guaranteeing the picture quality of display of an IPS liquid crystal display device.

Upon concrete implementation, in the above array substrate provided by the invention, the number of wire 10 may be one, and may also be more than one. Specifically, when the provided wire 10 is two, two wires 10 may be arranged at respective ones of ends within a pixel near two data lines 02, respectively, and so, the signal interference with adjacent pixel electrodes 05 from the two data line 02 can be shielded by the two wires 10, respectively.

When the provided wire 10 is one, the wire 10 may be arranged at one end within a pixel near a thin film transistor, and so, the area of a pixel region occupied by the wire 10 can be decreased as far as possible on the basis of transferring a common electrode signal on a common electrode line 03 to a common electrode 07.

Further, when the wire 10 is one, for the sake of obviating a data line 02 at the other end from producing signal interference to an adjacent pixel electrode 05, upon concrete implementation, as illustrated in FIG. 3 and FIG. 4, a pixel may further include a shielding electrode line 11 located at one end far way from a thin film transistor 04. The shielding electrode line 11 has the same extending direction as the data line 02; and the orthographic projection of the shielding electrode line 11 on the array substrate may be located between the data line 02 and an adjacent pixel electrode 05, may also be located within the region where the data line 02 is located, and may also be partially located within the region where the data line 02 is located. The added shielding electrode line 11 can also serve a function of shielding the signal interference with an adjacent pixel electrode 05 from the voltage change of the data line 02.

Upon concrete implementation, in the above array substrate provided by the invention, as illustrated in FIG. 3, one end of the shielding electrode line 11 may be electrically connected to a common electrode line 03, or, the other end of the shielding line 11 may be electrically connected to a common-electrode connecting section 08, or, both ends of the shielding electrode line 11 may also be arranged to be floated. No limit will be set here. Upon concrete implementation, in the above array substrate provided by embodiments of the invention, the shielding electrode line 11 may be arranged in any of the above modes, and no limit will be set here. In such a way, the interference to the voltage on a pixel electrode 05 caused by the voltage change of a data line 02 can be shielded by the shielding electrode line 11, thereby guaranteeing the quality of a display picture of an IPS liquid crystal display device.

Upon concrete implementation, in the above array substrate provided by the invention, the shielding electrode line 11 and the wire 10 may be disposed in the same layer as the common electrode line 03. During manufacture of the array substrate, the manufacturing process can be simplified, and pattern of the shielding electrode line 11, the wire 10 and the common electrode line 03 can be formed by using one process.

Hereinafter, taking the structure of the above array substrate as an example, the manufacturing process of it will be described in detail.

Figure 5:
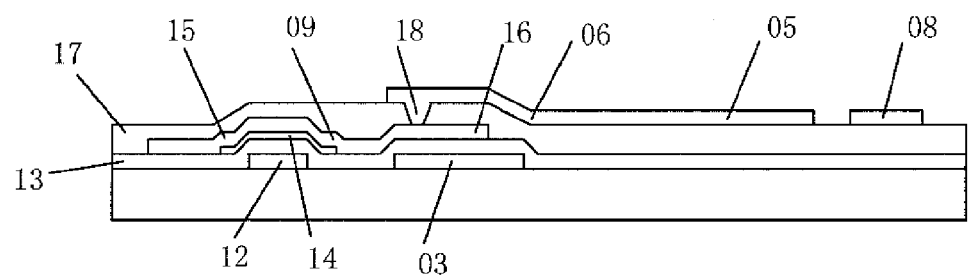
FIG. 5 is a structural schematic sectional view taken along A-A of a schematic view illustrating the detailed structure of an array substrate provided by the invention.

Step 1, a metal layer is deposited, and subjected to a patterning process (for example, which may include photoresist coating, exposure and development, etching, and so on), so as to form a gate line 01, a gate electrode 12 of a thin film transistor, a common electrode line 03, a wire 10, and a shielding electrode line 11, as illustrated in FIG. 5. The gate line 01 and the common electrode line 03 may be fabricated by using copper, aluminum, molybdenum or other metallic material, and may also be fabricated by using an alloy material. A single-layered structure may be used for the gate line 01, and a multilayered structure may also be used for it. No limit will be set here.

Step 2, a gate insulating layer 13 is deposited, wherein, the gate insulating layer 13 may be fabricated by using silicon nitride or silicon oxide material. A single-layered structure may be used for the gate insulating layer 13, and a multilayered structure may also be used for it. As illustrated in FIG. 5, it shows the structure of the gate insulating layer 13 in the array substrate.

Step 3, a semiconductor layer (i.e. an active layer) is deposited, and the active layer 14 may be fabricated by using amorphous silicon, or indium gallium zinc oxide or other oxide semiconductor material. Patterning (e.g., which includes photoresist coating, exposure and development, etching, and so on) is conducted on the semiconductor layer so as to form pattern of the active layer 14. As illustrated in FIG. 5, it illustrates the structure of the active layer 14 in the array substrate.

Step 4, a metal layer is deposited, and subjected to patterning (e.g., which includes photoresist coating, exposure and development, etching and so on) so as to form a data line 02, a source electrode 15 and a drain electrode 09 of the thin film transistor 04, as well as a storage capacitance electrode 16. The storage capacitance electrode 16 forms an integral structure with the drain electrode 09 of the thin film transistor 04, as illustrated in FIG. 5.

Figure 6:
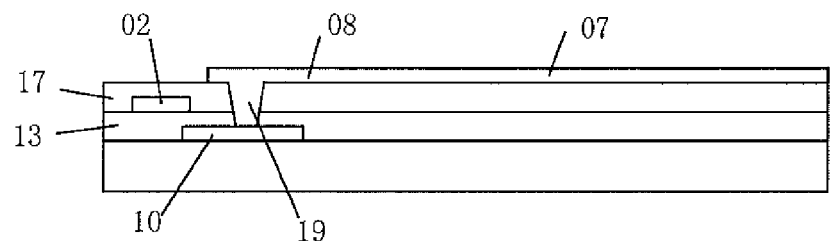
FIG. 6 is a structural schematic sectional view taken along C-C of a schematic view illustrating the detailed structure of an array substrate provided by the invention.

Step 5, a passivation layer 17 is deposited, and it may be fabricated by using an inorganic substance such as silicon nitride, or an organic substance such as a resin. A patterning process (e.g., which includes photoresist coating, exposure and development, etching and so on) is conducted on the passivation layer, so as to form a first via hole 18 and a second via hole 19, as illustrated in FIG. 5 and FIG. 6.

Step 6, a conductive material layer of a metallic material or a transparent metal oxide is deposited, and subjected to patterning process (e.g., which includes photoresist coating, exposure and development, etching and so on), so as to form a pixel electrode 05, a pixel-electrode connecting section 06, a common electrode 07 and a common-electrode connecting section 08. The storage capacitance electrode 16 is connected to the pixel-electrode connecting section 06 through the first via hole 18, as illustrated in FIG. 5; the wire 10 is connected to the common-electrode connecting section 08 through the second via hole 19, as illustrated in FIG. 6.

Upon concrete implementation, the above array substrate provided by embodiments of the invention may be applied to liquid crystal display panel, and may also be applied to organic electroluminescent display panel, and no limit will be set here.

Based on the same inventive concept, according to an embodiment of the invention, there is further provided a display device, which includes the above array substrate provided by embodiments of the invention. The display device may be a display, a cell phone, a television, a notebook, an all-in-one machine, or the like. As for all the other indispensable constituents of the display device possessed as should be understood by those ordinarily skilled in the art, they will not be described here, and shall not be construed as limitative of the present invention, either.

An array substrate and a display device are provided by embodiments of the invention, and a common electrode line with the same extending direction as a gate line in the array substrate is disposed at one end near a thin film transistor, and forms a storage capacitor with a drain electrode of the thin film transistor. As compared with the case in the prior art that a common electrode line and a thin film transistor in an array substrate are disposed at both ends of a pixel, respectively and it is necessary to separately provide a storage capacitance electrode useful for forming a storage capacitor with the common electrode line, the pixel region occupied by the thin film transistor and the common electrode line can be effectively decreased. Thus, the aperture ratio is increased, and the display brightness of an IPS liquid crystal display device is enhanced.

Descriptions made above are merely exemplary embodiments of the invention, but are not used to limit the protection scope of the invention. The protection scope of the invention is determined by attached claims.

This application claims the benefit of priority from Chinese patent application No. 201420317656.1, filed on Jun. 13, 2014, the disclosure of which is incorporated herein in its entirety by reference as a part of the present application.

The invention claimed is:

1. An array substrate, comprising:
a base substrate; and
a plurality of gate lines, a plurality of data lines, and a common electrode line disposed on the base substrate, wherein a region defined by adjacent gate lines of the plurality of gate lines and adjacent data lines of the plurality of data lines is a pixel, and the pixel comprises:
   a thin film transistor lying in the vicinity of an intersection of a gate line of the adjacent gate lines and a data line of the adjacent data lines and electrically connected to the gate line and the data line, respectively,
   a plurality of pixel electrodes,
   a pixel electrode connecting section connected to the plurality of the pixel electrodes,
   a plurality of common electrodes disposed in a same layer as and arranged alternatingly with the plurality of pixel electrodes, and
   a common electrode connecting section connected to the plurality of the common electrodes,
wherein, the common electrode line has a same extending direction as the gate line, and is located at one end of the pixel near the thin film transistor, and forms a storage capacitor with a drain electrode of the thin film transistor,
wherein the pixel further comprises a wire for electrically connecting the common electrode line and each of the plurality of common electrodes, and
wherein a vertical projection of the wire on the base substrate overlaps with a vertical projection of the data line adjacent to the wire on the base substrate.

2. The array substrate according to claim 1, wherein, the wire is electrically connected to the plurality of common electrodes through the common electrode connecting section.

3. The array substrate according to claim 2, wherein, the vertical projection of the wire on the base substrate lies within the vertical projection of the data line adjacent to the wire on the base substrate.

4. The array substrate according to claim 1, wherein, the wire is provided singly, and is located at one of two opposite ends of the pixel closer to the thin film transistor.

5. The array substrate according to claim 4, wherein,
the pixel further comprises a shielding electrode line located at one end far away, relative to the wire, from the thin film transistor;
the shielding electrode line has a same extending direction as the data line; and
an end of the shielding electrode line is floated and spaced apart from the common electrode connecting section.

6. The array substrate according to claim 5, wherein both ends of the shielding electrode line are arranged to be floated.

7. The array substrate according to claim 6, wherein, the shielding electrode line is disposed in a same layer as the wire and the common electrode line.

8. The display device according to claim 5, wherein, a vertical projection of the shielding electrode line on the base substrate overlaps with a vertical projection of the data line adjacent to the shielding electrode line on the base substrate.

9. The display device according to claim 8, wherein, the vertical projection of the shielding electrode line on the base substrate lies within the vertical projection of the data line adjacent to the shielding electrode line on the base substrate.

10. The array substrate according to claim 1, wherein, the pixel electrodes and the common electrodes are strip-like electrodes extending in a direction parallel to the data line, and the plurality of pixel electrodes and the plurality of common electrodes are distributed alternately.

11. The array substrate according to claim 10, wherein, the pixel electrode connecting section extends along a direction parallel to the gate line, and ends of the plurality of pixel electrodes near, relative to opposite ends of the plurality of pixel electrodes, the thin film transistor are connected together; and the common electrode connecting section extends along a direction parallel to the gate line, and ends of the plurality of common electrodes far away, relative to opposite ends of the plurality of common electrodes, from the thin film transistor are connected together.

12. A display device, comprising the array substrate according to claim 1.

13. The display device according to claim 12, wherein, the wire is electrically connected to the common electrodes through the common electrode connecting section.

14. The display device according to claim 13, wherein, the vertical projection of the wire on the base substrate lies within the vertical projection of the data line adjacent to the wire on the base substrate.

15. The display device according to claim 12, wherein, the wire is provided singly, and is located at one of two opposite ends of the pixel closer to the thin film transistor.

16. The display device according to claim 15, wherein,
the pixel further comprises a shielding electrode line located at one end far away, relative to the wire, from the thin film transistor;
the shielding electrode line has a same extending direction as the data line; and
an end of the shielding electrode line is floated and spaced apart from the common electrode connecting section.

17. The display device according to claim 16, wherein, a vertical projection of the shielding electrode line on the base substrate overlaps with a vertical projection of the data line adjacent to the shielding electrode line on the base substrate.

18. The display device according to claim 17, wherein, the vertical projection of the shielding electrode line on the base substrate lies within the vertical projection of the data line adjacent to the shielding electrode line on the base substrate.

* * * * *